(12) United States Patent
Dudesek et al.

(10) Patent No.: US 7,816,293 B2
(45) Date of Patent: Oct. 19, 2010

(54) CERAMIC MATERIAL, SINTERED CERAMIC AND COMPONENT MADE THEREFROM, PRODUCTION METHOD AND USE OF THE CERAMIC

(75) Inventors: Pavol Dudesek, Bad Gams (AT);
Christian Hoffman, Deutschlandsberg (AT); Matjaz Valant, Ljubljana (SI);
Danilo Suvorov, Ljubljana (SI)

(73) Assignee: EPCOS AG, Munich (DE)

( * ) Notice: Subject to any disclaimer, the term of this patent is extended or adjusted under 35 U.S.C. 154(b) by 106 days.

(21) Appl. No.: 12/275,645

(22) Filed: Nov. 21, 2008

(65) Prior Publication Data
US 2009/0155624 A1 Jun. 18, 2009

Related U.S. Application Data

(63) Continuation of application No. PCT/DE2007/000847, filed on May 9, 2007.

(30) Foreign Application Priority Data
May 23, 2006 (DE) .................... 10 2006 024 231

(51) Int. Cl.
*C04B 35/453* (2006.01)
*H01G 4/12* (2006.01)
*H01G 4/30* (2006.01)

(52) U.S. Cl. .............. 501/134; 428/210; 428/325; 428/697; 428/702; 264/614; 264/615; 361/321.4

(58) Field of Classification Search .............. 501/134; 428/210, 325, 697, 702; 264/614, 615; 361/321.4
See application file for complete search history.

(56) References Cited

U.S. PATENT DOCUMENTS

| 4,242,213 | A | 12/1980 | Tamura et al. | |
|---|---|---|---|---|
| 5,449,652 | A * | 9/1995 | Swartz et al. | 501/134 |
| 6,395,663 | B1 * | 5/2002 | Chen et al. | 501/134 |
| 6,680,269 | B2 * | 1/2004 | Sogabe et al. | 501/134 |

FOREIGN PATENT DOCUMENTS

| FR | 2 845 685 | 4/2004 |
|---|---|---|
| WO | WO 97/10189 | 3/1997 |

OTHER PUBLICATIONS

Jeanne, G., et al., "Synthese et Evolution Structurale de Nouveaux Pyrochlores au Bismuth," 1974, pp. 1321-1331, Materials Research Bulletin, vol. 9 No. 10.

(Continued)

*Primary Examiner*—Karl E Group
(74) *Attorney, Agent, or Firm*—Slater & Matsil, L.L.P.

(57) ABSTRACT

A ceramic mixed system is proposed that includes a two-phase mixture of pure components A and B, wherein phase A is based on the cubic to tetragonal modification of $Bi_3NbO_7$ and phase B is based on a monoclinic pyrochlore modification of $Bi_2(Zn_{2/3}Nb_{4/3})O_7$. The electrical properties of ceramics produced therefrom make the material suitable for components having a multilayer structure in which capacitors and inductors are integrated and which can be used in data processing or signal processing.

22 Claims, 2 Drawing Sheets

OTHER PUBLICATIONS

Nino, J., et al.,"Bi-pyrochlores—Processing, Structure and Properties," Center for Dielectric Studies, CDS Fall Meeting, Oct. 16, 2001, 39 pages.

Chen, S.-Y., et al., "Phase transformation, reaction kinetics and microwave characteristics of $Bi_2O_3$-ZnO-$Nb_2O_5$ ceramics," Journal of the European Ceramic Society, vol. 23, 2003, pp. 873-881.

Valant, M., et al., "Dielectric Properties of the Fluorite-Like $Bi_2O_3$-$Nb_2O_5$ Solid Solution and the Tetragonal $Bi_3NbO_7$," Journal of the American Ceramic Society, Jun. 2003, pp. 939-944, vol. 86, No. 6.

Wang, X., et al., "Structures, Phase Transformations, and Dielectric Properties of Pyrochlores Containing Bismuth," Journal of the American Ceramic Society, 1997, pp. 2745-2748, vol. 80, No. 10.

Aguado, E., et al., "Síntesis, caracterización estructural y medidas de conductividad de $Bi_3NbO_7$," Boletín de la Sociedad Española de Cerámica y Vidrio Articulo, Sep.-Dec. 1995, pp. 417-420, vol. 34 No. 5-6.

* cited by examiner

CERAMIC MATERIAL, SINTERED CERAMIC AND COMPONENT MADE THEREFROM, PRODUCTION METHOD AND USE OF THE CERAMIC This application is a continuation of co-pending International Application No. PCT/DE2007/000847, filed May 9, 2007, which designated the United States and was not published in English, and which claims priority to German Application No. 10 2006 024 231.9 filed May 23, 2006, both of which applications are incorporated herein by reference.

BACKGROUND

LTCC (Low Temperature Cofired Ceramic) technology makes it possible to realize ceramic multilayer components with several metallization levels, into which a plurality of passive components such as conductor traces, resistors, capacitors and inductors can be integrated. Thus, circuits and components comprising these circuits can be realized in LTCC ceramic substrates.

The greater the dielectric constant of the ceramic material that is used in LTCC technology, the higher an integration of capacitors is possible. On the other hand, an excessively high dielectric constant is disadvantageous for the integration of the inductors, so that the ceramic selection must be optimized with regard to its dielectric constant. Further requirements of the ceramic material are a sufficiently low sintering temperature to enable the use of economical electrode materials such as silver. In addition, the ceramic material should have only a slight temperature variance of its dielectric and other properties so that the component produced with LTCC technology can be used in a wide temperature interval without its properties changing excessively.

So far it has not been possible to find a ceramic material having a dielectric constant above twenty with a sufficiently low sintering temperature, or whose dielectric constants have the necessary temperature stability and which can be processed with LTCC technology.

SUMMARY

In one aspect, the present invention specifies a ceramic material from which components of the aforementioned type can be realized without the necessity to tolerate the above-mentioned drawbacks.

As an example, a ceramic material is proposed which includes of a mixture of two pure phases, A and B. The phase mixture has a composition $xA+(1-x)B$, where x is greater than 0 and less than 1. Phase A is a cubic to tetragonal modification of $Bi_3NbO_7$. Phase B is based on a monoclinic pyrochlore modification of the system $Bi_2(Zn_{2/3}Nb_{4/3})O_7$. The two phases A and B form respective pure-phase domains in the mixture.

Starting from the above basic composition, which determines the crystal structure of the pure phases, each of the two phases can be varied such that the elements Bi, Zn and Nb can be replaced in the material as a whole by other metals up to a proportion of 30 mol %. In addition, niobium can be completely replaced by tantalum. The other metals present in certain portions as replacements are preferably selected such that they have the same or similar valence, with comparable atomic diameters, so that they can replace the initial elements at their lattice sites without problems, or without excessively large lattice distortions of the respective crystalline phase.

In particular, bismuth can be replaced up to a proportion of 30 mol % by one or more elements selected from Ca, Sr, Ba, Pb, Cd, Y, La and a rare-earth element with an atomic number of 58-71. A corresponding element replacement does not lead to a change of the crystal modification in either of the two phases A and B.

In phase B, zinc can be replaced up to a proportion of 30 mol % by one or more elements selected from Mg, Ca, Co, Mn, Ni, Fe, Cr and Cu. Here too, the crystal modification is not influenced by the corresponding exchange.

The element niobium can be replaced in each of the two pure phases up to a proportion of 30 mol % by one or more elements selected from Sn, Ti, Hf, Sb, Ta, V, W and Mo. These replacements also do not lead to a variation of the crystal modification. Moreover, Nb can be replaced completely by Sb without the phase of the pure phase or mixed phase changing thereby.

Advantageous compositions of the proposed ceramic materials can be defined in the phase diagram of the three elements Zn—Nb—Bi by four points A, B, C, D forming a square. Compositions lying inside this square are well suited in the sense of the invention and, in particular, have suitable low sintering temperatures, sufficiently high dielectric constants and a high dielectric quality factor. The four points A through D are defined by their contents in the ceramic material expressed in mol %.

A: Zn=4.0; Nb=30.0; Bi=66.0
B: Zn=7.8; Nb=25.0; Bi=67.2
C: Zn=16.0; Nb=30.0; Bi=54.0
D: Zn=15.0; Nb=35.0; Bi=50.0

From the above materials, ceramic bodies can be sintered at a temperature of below 960° C., and advantageously even below 900° C. Ceramics can be obtained whose dielectric constant lies between 65 and 95. Such ceramics can simultaneously have dielectric quality factors of more than 800, determined in each case at a measurement frequency of one gigahertz.

In an advantageous ceramic, the molar ratio x of phase A in the ceramic material lies between 0.1 and 0.8. For example, a 1:1 mixture of the two phases A and B is advantageous. An essential advantage of a ceramic composition with nearly equal proportions of the pure phases A and B is that the temperature coefficients of the material, and the temperature coefficients of the dielectric constants of the two phases in particular, are equalized in this manner and can accordingly be minimized overall in the ceramic material. This is based on the fact that the pure phase A has a negative temperature coefficient of the dielectric constant, but the pure phase B has a positive one. For example, a temperature coefficient of the dielectric constant between −44° C. and +155° C. (measured by means of the resonant frequency of a resonator made therefrom) of only −5 ppm is obtained with a 1:1 mixture of phases A and B. Such a ceramic has an $\in$ of 81, a dielectric quality factor Q of 1000 (measured at one gigahertz), or a product Q×f=1000 GHz.

The ceramic material of the invention has the additional advantage that it behaves inertly with respect to silver-containing electrode material at temperatures up to and above the sintering temperature. This makes it possible to print green bodies of ceramic material with silver-containing electrodes and sinter them together into finished components without the phase composition changing due to exchange of individual elements for silver or additional incorporation of silver. Therefore, the ceramic material and the ceramic produced from it are outstandingly suitable for ceramic components and, in particular, for ceramic multilayer components using economical silver electrodes.

The above-mentioned properties are reliably obtained if phases A and B are present in the specified initial composition ratio. With the exception of the replacement of niobium by tantalum, which can be done up to 100% without the properties of the ceramic changing substantially, the properties are sufficiently changed by the partial replacement of one or more elements by the above-mentioned substitution atoms that only a replacement up to the above-mentioned proportion of 30 mol % still leads to ceramics that are usable for the above-mentioned purpose.

Restrictions can result, for example, from the fact that the proportion of bismuth in the ceramic as a whole declines because of an unsuitable phase-mixing ratio and excessive replacement of the bismuth. In this case, a diminishing stability of the ceramic material with respect to silver-containing electrode material can be observed, which leads to modification of the phases to the point of undefined compositions with possibly less suitable properties, which moreover are difficult to monitor. A secure stability is obtained if the bismuth content in the ceramic material as a whole is more than 50 mol %. In individual cases, ceramic compositions with lower bismuth content can be obtained which are nonetheless stable with respect to silver-containing materials during sintering.

A component produced from this ceramic material, or from a ceramic sintered from it, can advantageously be constructed with a multilayer structure, wherein a plurality of ceramic layers in a monolithic ceramic body alternate with metallization levels arranged between them. The ceramic layers are sintered together in the stack, wherein passive components or a connection of passive components result from the structured metallization levels, which are connected to one another by means of through connections.

The connection of passive components in their entirety can yield a complete, stand-alone component, which is constructed, for example, as an LC filter for mobile telephony applications. It is also possible to use a multilayer ceramic made from the above-mentioned ceramic material with integrated passive components realized therein as a substrate for electrical components and, in particular, as a substrate for modules with different electrical components. Such a substrate can present the necessary connections as well as the necessary matching elements for the individual components or ICs integrated on the module.

To manufacture the ceramic material of the invention, one starts from the known pure phases A and B. Phase A is described in, for example, "Solid Solutions $Bi_2O_3$—$Nb_2O_5$" by M. Valant and D. Suvrov in J. Am. Cer. Soc. 86 [6] 939-944 (2003). Phase B is described in, for example, the article "Structures, Phase Transformations and Dielectric Properties of Pyrochlores Containing Bi" by X. V. Wang in J. Am. Cer. Soc. 80 [10] 2745-2748 (1997). These pure phases are produced separately from one another, the so-called mixed oxide process being advantageously used. For this purpose, the individual elements are mixed with one another in the form of oxides at a desired molar ratio, the powder mixture is ground and homogenized, and then subjected to a suitable temperature program, which leads to a desired crystal modification of phases A and/or B. The pure phases are advantageously produced in two-stage calcinations and sintering processes, wherein a first stage is performed at a lower temperature in order to prevent an excessively strong evaporation of volatile phases from the bismuth oxide and thus a depletion of bismuth in the material.

In the production of pure phase A, it is advantageous to maintain a longer residence phase at ca. 800° C., in order to allow at least a partial phase transition from the cubic to the preferred tetragonal phase. A ceramic material according to the invention can, however, also have an A phase that has not completely transitioned into the tetragonal phase, and nevertheless has the desired properties.

After production of the pure phases, they are ground down to a particle size of less than 2 μm. The powders with the pure phases are mixed at the desired ratio for the two-phase mixture, homogenized, and green films are made from them. Grinding to the aforementioned particle size can also take place after the mixing of the pure phases, for example.

Through connections are then produced in the green films by punching, for example, and then filling with conductive material such as a paste containing metal particles. Then the metallization structures are printed in the form of metal-containing sinterable pastes.

Then several of these films are stacked such that, by means of the through connections, there is a suitable connection of the metallization structures, which then, in cooperation with the ceramic arranged therebetween, yield the desired component functions.

The stacked films are then fixed by means of lamination. After this process step, multilayer ceramics, originally produced over large surface areas and containing a plurality of individual components or individual substrates for components, can be separated by a subdivision process such as cutting. Subsequently, the laminated green films are sintered.

It turns out that once the pure phases have been produced, they are thermodynamically stable even in the homogeneous mixing of the two-phase mixture until above the sintering temperature, so that no phase transformations need be feared even during mixing. Thus only a densification of the green films is performed in the sintering process, whereby the entire sintering process can be performed rapidly. There is fast heating to the sintering temperature of, for instance, 900° C., which is briefly maintained, and then there is fast cooling.

BRIEF DESCRIPTION OF THE DRAWINGS

The invention will be described in detail below with reference to embodiments and the associated figures.

DETAILED DESCRIPTION

Figure 1:
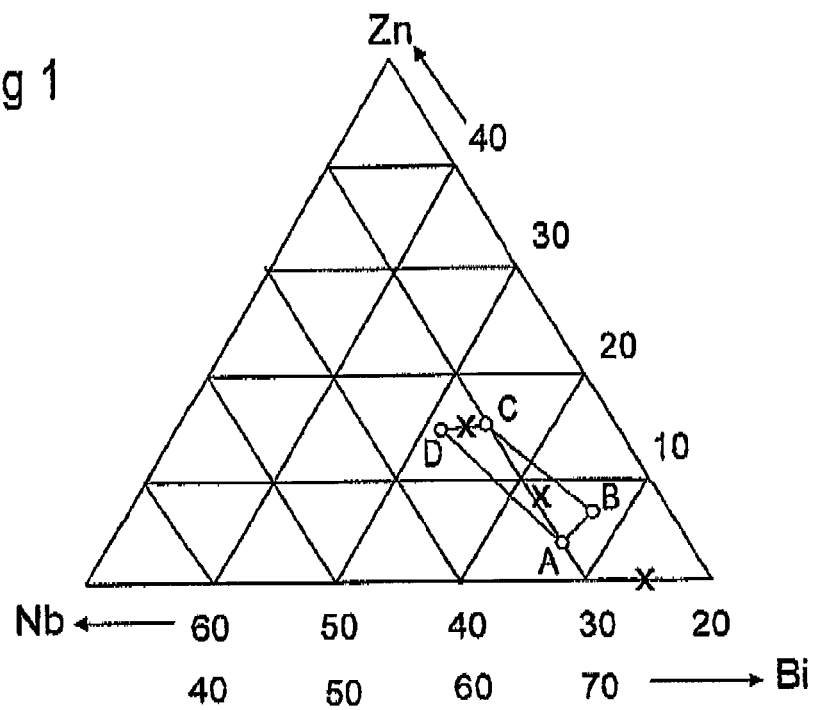
FIG. 1 shows an excerpt of a three-phase diagram of the Nb, Bi and Zn system, in which advantageous compositions are entered.

FIG. 1 shows an excerpt of the three-phase diagram ZnO—$BiO_{1.5}$—$NbO_{2.5}$. In the diagram, a quadrilateral is described by the four points A through D, in which each point of the enclosed surface represents a composition of a ceramic according to the invention with advantageous properties. The coordinates in mol % for the different points A, B, C and D are as follows:

A: Zn=4.0; $NbO_{2.5}$=30.0; $BiO_{1.5}$=66.0
B: Zn=7.8; Nb=25.0; Bi=67.2
C: Zn=16.0; Nb=30.0; Bi=54.0
C: Zn=15.0; Nb=35.0; Bi=50.0.

In addition, three compositions labeled X and lying on a line are drawn in the phase diagram. The outer two points are formed by the two pure phases A and B. The point in the middle of the line represents a 1:1 composition of the two phases. This embodiment has nearly optimal properties, which make the ceramic suitable for use in those electrical components in which a capacitor and/or an inductor are realized, and which are suitable for use in high-frequency technology and, in particular, as components for use in wireless communications systems. The 1:1 composition has, as already mentioned, a dielectric constant $\in$ of 81, a quality factor Q of 1000 (determined at one gigahertz), a temperature coefficient of resonant frequency of −5 ppm, determined on a resonator produced from this ceramic, and a product of quality and frequency of 1000 GHz.

The high dielectric constant, which allows miniaturization of the corresponding components, and the very small temperature coefficient, which results according to the invention from the opposite temperature coefficients of the two pure phases A and B, which equalize one another in the ceramic mixture of the invention, are very advantageous. The sintering temperature of the mixed phase is also substantially lower than that of the pure phase B, which is above 950° C. Mixed phases lying in the vicinity of the 1:1 composition show results that are similarly positive to those of the one-to-one mixed phase. It is generally true in this regard that the properties for the above-mentioned or desired application purposes are relatively the least favorable for compositions near the pure phases A and B. It is true for all mixed phases according to the invention that they have improved properties, in particular, an improved temperature coefficient, compared to the pure phases. For example, mixture ratios from 1:9 to 9:1 have quite suitable properties. It is true in general that better properties are obtained in the vicinity of pure phase B than in the vicinity of pure phase A.

Figure 2:
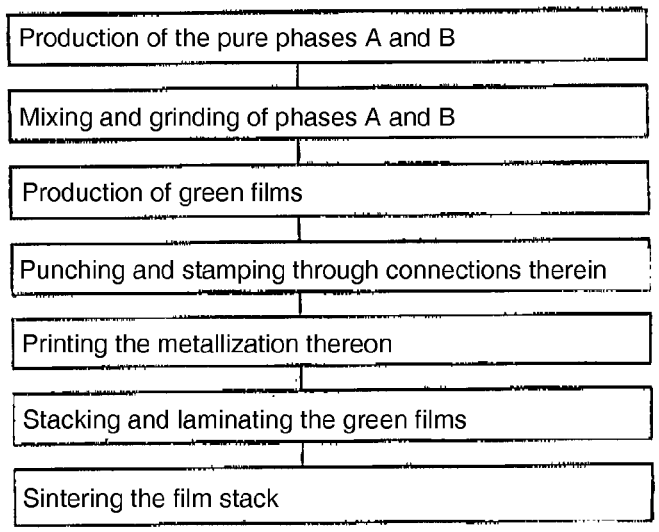
FIG. 2 presents a process flow diagram of the production of the component.

FIG. 2 presents a process sequence diagram of the manufacturing of an electrical multilayer component with several layers of ceramics with the composition according to the invention. In the first step, the pure phases A and B are produced separately from one another, preferably according to the mixed oxide process. Therein, metal oxides in electronic grade quality are added together in the necessary ratio, ground and homogenized, and subsequently calcined and sintered. The calcination preferably takes place in two steps, wherein the first step is performed at a relatively low temperature in order to avoid an excessive vaporization of volatile bismuth phases. For component A, a rather long residence time at 800° C. is maintained, in which at least a partial transition from the original cubic phase to the tetragonal phase takes place. According to the invention, the tetragonal phase is particularly suitable, but can contain portions of cubic phase without unfavorably influencing the electrical properties of ceramic compositions according to the invention. The pure phase B originates as a monoclinic pyrochlore phase.

In the next step, the pure phases A and B are combined in a desired ratio, mixed and finely ground until a particle diameter of 2 μm or less is achieved. Because of the grinding of the two pure phases together, a homogeneous mixture of finely ground particles with phase-pure domains results.

In the next step, green film is produced from the homogenized mixed phases. For this purpose, the finely ground powder is made into a slurry with a solvent, which can contain portions of a viscous binder if desired, and green film is made therefrom, for instance, by film drawing or film casting. In the next step, after drying and thus removal of the solvent from the green film, the through connections necessary for a desired component are produced by punching, for example. These through connections are then filled with a conductive compound containing metal particles, using a doctor blade for instance. Finally, metallization structures are printed onto the green films by means of a screen printing process, for example. A metallization structure produced on a green film corresponds to a metallization level in the subsequent multilayer ceramic.

In the next step, the printed green films are stacked one atop the other in the proper order of the component and laminated into a compact body. It already has some mechanical strength and can advantageously be subdivided even in this stage by cutting or punching. This is necessary since the green films are typically produced with a large surface area, on which the metallization structures for a great number of identical or different components can be produced one alongside the other. These components are separated from one another by this subdivision.

In the next step, the separated film stacks are sintered. A monolithic ceramic multilayer component is obtained, in which different passive component functions, such as capacitors and inductors, can be realized by means of the interaction of metallization structures in different metallization levels that are connected to one another by through connections. In a final step, external electrodes can be applied to the monolithic ceramic component, insofar as they have not already been applied in an integrated manner to the green films before the sintering.

Figure 4:
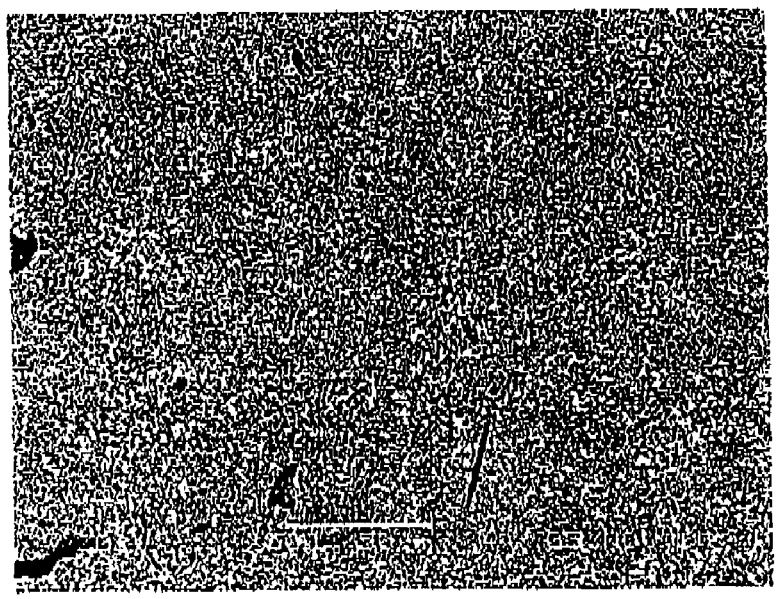
FIG. 4 shows the ceramic structure of a ceramic with a composition according to the invention on the basis of a photo.

On the basis of a polished section through a solid ceramic body according to the invention, FIG. 4 shows its ceramic structure. The image shows that the mixed phase is formed from a continuous phase that can be overwhelmingly associated with the pure phase A. The bright dots therein are inclusions that can be associated with the pure phase B. The black dots or areas are due to remaining pores or impurities of this test sample. It can be discerned from the film that grain growth has taken place in the sintering. Grain diameters of typically up to 5 μm, and in some cases up to 10 μm, can be identified.

Figure 3:
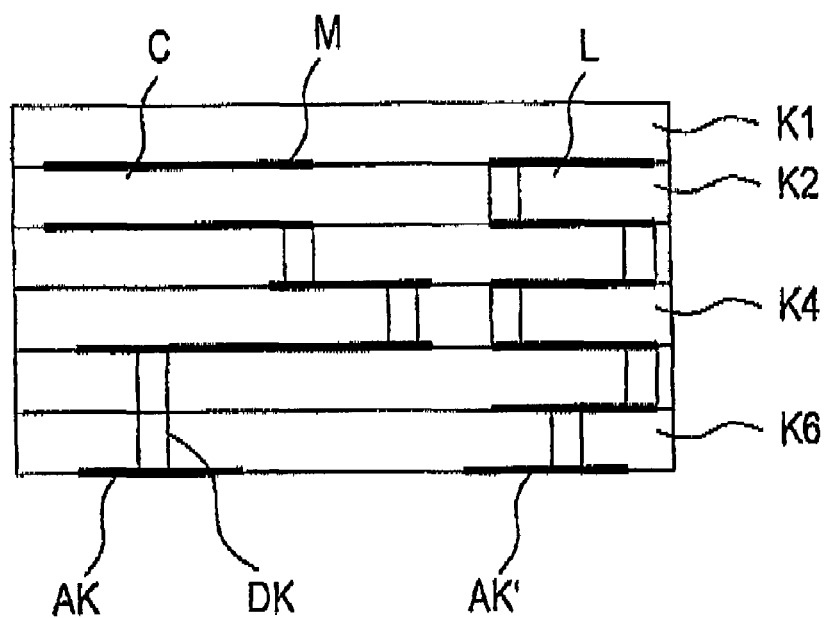
FIG. 3 shows a component produced according to the invention in schematic cross section.

FIG. 3 shows a possible component of the type that can be obtained or realized with the two-phase mixed ceramic according to the invention. The component shown here for the sake of example has six stacked and sintered-together ceramic layers K1-K6. A metallization level in which metallization structures M have been structured is provided between each two ceramic layers K. The necessary electrical connections between the metallization structures M of different metallization levels are performed by the aforementioned through connections DK.

In FIG. 3, two components of the element are indicated, namely a capacitor C that is produced by two metal surfaces arranged in neighboring metallization levels. Alongside it, an inductor L is indicated which consists, for instance, of a helix-like structure of several half-loops connected together by through connections. The external contacts AK, AK', with which the component can be contacted with an external circuit environment, are provided on the underside of the ceramic body. Such a component can be formed, for example, as an LC filter, in which a suitable connection of L and C elements realizes a bandpass filter of the type used in terminal devices for mobile communication.

It is also possible to use the multilayer ceramic of the invention as a substrate for other components. For that purpose, in addition to the external contacts on the underside, the multilayer ceramic has contact areas on the upper side (not shown in the figure), by means of which a discrete or integrated component, or a desired component chip, can be mounted. As an example, the component can be a piezoelectric crystal provided with metallization structures of a component operating with surface acoustic waves.

The metallization structures of ceramic components realized with the ceramic according to the invention can consist of silver or any desired other metals resistant to the sintering temperature. The through connections can likewise be filled with silver-containing material or with silver-palladium alloy. The ceramic can be formed as a compact body with a multilayer structure. It is also possible to connect and sinter appropriately structured green films in which three-dimensional structures are realized. Thus, it is possible for instance, to realize a cavity, which can be opened or closed, in the multilayer stack. In an open cavity, for example, a discrete component can be arranged and connected to the metallization structures. This permits the realization of a particularly compact component.

The invention is not limited to the embodiment examples presented in detail. Additional compositions in which the metallic components of the pure phases are exchanged for the above-mentioned replacement atoms in the aforementioned scope of at most 30 mol percent lie within the scope of the invention. The crucial factor for the exchange and the properties of the ceramic achieved thereby is the preservation of the respective crystal structures of the pure phases. As a rule, metals that are similar with respect to valence and atomic diameter can be exchanged for one another. Compounds that contain only slight components of one of the two phases and therefore consist overwhelmingly of the other pure phase are also mixtures of the two pure phases A and B according to the invention. Compared to the pure phases, each of the mixed phases has improved characteristics with regard to the desired spectrum of properties.

The components produced from the ceramic are likewise not restricted to the embodiments mentioned above. In principle, a number of different electroceramic components can be produced from the ceramic, the ceramic being particularly suitable, however, for those components in which various passive components are integrated. Such components can preferably be used wherever they are not subjected to maximal power, as in signal-processing and data-processing components in particular.

What is claimed is:

1. A ceramic material, comprising:
   a two-phase mixture $xA+(1-x)B$,
   wherein $0 \leq x \leq 1$,
   wherein phase A is based on a cubic to tetragonal modification of $Bi_3NbO_7$,
   wherein phase B is based on a monoclinic pyrochlore modification of $Bi_2(Zn_{2/3}Nb_{4/3})O_7$, and
   wherein the two phases can be varied such that Bi, Zn and Nb in the entire material are each replaced up to a proportion of 30 mol % by other metals, but Nb can be replaced up to 100% by Ta.

2. The material according to claim 1, wherein Bi can be replaced up to a proportion of 30 mol % by one or more elements selected from the group consisting of Ca, Sr, Ba, Pb, Cd, Y, La and a rare-earth element with an atomic number of 58-71.

3. The material according to claim 1, wherein Zn can be replaced up to a proportion of 30 mol % by one or more elements selected from the group consisting of Mg, Ca, Co, Mn, Ni, Fe, Cr and Cu.

4. The material according to claim 1, wherein Nb can be replaced up to a proportion of 30 mol % by one or more elements selected from Sn, Ti, Hf, Sb, Ta, V, W and Mo.

5. The material according to claim 1, defined in the phase diagram of the elements Zn—Nb—Bi by the four points A, B, C, D with
   A: Zn=4.0; Nb=30.0; Bi=66.0
   B: Zn=7.8; Nb=25.0; Bi=67.2
   C: Zn=16.0; Nb=30.0; Bi=54.0
   D: Zn=15.0; Nb=35.0; Bi=50.0.

6. The material according to claim 1, wherein the ceramic material consists of the two-phase mixture $xA+(1-x)B$.

7. A sintered ceramic of a material according to claim 1, with a sintering temperature below 960° C.

8. The ceramic according to claim 7, with a dielectric constant of 65-95.

9. The ceramic according to claim 7, with a dielectric quality factor of more than 800 at a measurement frequency of 1 GHz.

10. The ceramic according to claim 7, wherein the relative molar ratio x of phase A in the ceramic material is 0.10 to 0.80.

11. The ceramic according to claim 7, wherein the phases in the mixture are present as pure phases of the main components.

12. The ceramic according to claim 7, wherein the diameters of the domains of the pure phases A and B are less than or equal to 10 µm.

13. An electrical component comprising a ceramic according to claim 7.

14. An electrical component comprising:
   a multilayer structure comprising a plurality of ceramic layers arranged alternately with structured metallization levels and sintered into a monolithic stack, each of the ceramic layers comprising a two-phase mixture $xA+(1-x)B$, wherein $0<x<1$, wherein phase A is based on a cubic to tetragonal modification of $Bi_3NbO_7$, wherein phase B is based on a monoclinic pyrochlore modification of $Bi_2(Zn_{2/3}Nb_{4/3})O_7$, and wherein the two phases can be varied such that Bi, Zn and Nb in the entire material are each replaced up to a proportion of 30 mol % by other metals, but Nb can be replaced up to 100% by Ta;
   a plurality of passive components formed in the multilayer structure; and
   a plurality of through connections, wherein the structured metallization levels are connected to one another by means of the through connections thereby interconnecting the passive components.

15. The component according to claim 14, wherein the passive components are interconnected to form an LC filter.

16. The component according to claim 15, wherein the passive components are interconnected to form an LC filter in LTCC technology for mobile telephony applications for the frequency range of 1-5 GHz.

17. The component according to claim 14, wherein the multilayer structure comprises a substrate for electrical components.

18. A method for producing a ceramic material, the method comprising:
   producing pure phases A and B separately from one another, phase A being based on a cubic to tetragonal modification of $Bi_3NbO_7$ and phase B being based on a monoclinic pyrochlore modification of $Bi_2(Zn_{2/3}Nb_{4/3})O_7$,
   grinding each of the pure phases to a powder; and
   mixing powders of the two pure phases in a predetermined ratio to form a two-phase mixture $xA+(1-x)B$, wherein $0<x<1$, wherein the two phases can be varied such that Bi, Zn and Nb in the entire material are each replaced up to a proportion of 30 mol % by other metals, but Nb can be replaced up to 100% by Ta.

19. The method according to claim 18, further comprising processing the mixture into a green body and sintering.

20. The method according to claim 19, wherein the sintering is performed at a temperature of less than 960° C.

21. The method according to claim 18, wherein producing pure phases A and B comprises producing the pure phases by a mixed oxide process.

22. The method according to claim 18, further comprising:
forming films as green bodies using the mixture punching through connections in the films;
filling the through connections with a conductive material;
printing the films with a metallization structure of an electrode material; and
stacking a plurality of different films one above the other;
laminating the stacked films; and
sintering the stacked films.

* * * * *

UNITED STATES PATENT AND TRADEMARK OFFICE
CERTIFICATE OF CORRECTION

| | | |
|---|---|---|
| PATENT NO. | : 7,816,293 B2 | Page 1 of 1 |
| APPLICATION NO. | : 12/275645 | |
| DATED | : October 19, 2010 | |
| INVENTOR(S) | : Dudesek et al. | |

It is certified that error appears in the above-identified patent and that said Letters Patent is hereby corrected as shown below:

In Col. 9, lines 5-6, claim 22, replace
"forming films as green bodies using the mixture punching through connections in the films;"
with
--forming films as green bodies using the mixture;
punching through connections in the films;--.

Signed and Sealed this
Twenty-eighth Day of December, 2010

David J. Kappos
*Director of the United States Patent and Trademark Office*